United States Patent
Koyama

(10) Patent No.: US 6,792,565 B1
(45) Date of Patent: Sep. 14, 2004

(54) ADDRESS CONVERSION DEVICE FOR NONVOLATILE MEMORY

(75) Inventor: Hiroshi Koyama, Isesaki (JP)

(73) Assignee: Sanyo Electric Co., Ltd., Osaka (JP)

(*) Notice: Subject to any disclaimer, the term of this patent is extended or adjusted under 35 U.S.C. 154(b) by 0 days.

(21) Appl. No.: 09/420,875

(22) Filed: Oct. 19, 1999

(30) Foreign Application Priority Data

Oct. 20, 1998 (JP) .......................................... 10-298446

(51) Int. Cl.$^7$ ............................................. G11C 29/00
(52) U.S. Cl. ............... 714/723; 365/185.09; 365/185.33
(58) Field of Search .......................... 714/723; 711/103, 711/206; 365/222, 185.09, 185.33

(56) References Cited

U.S. PATENT DOCUMENTS

| | | | | |
|---|---|---|---|---|
| 5,359,570 A | * | 10/1994 | Hsu et al. .............. | 365/185.09 |
| 5,457,658 A | * | 10/1995 | Niijima et al. ......... | 365/185.29 |
| 5,479,638 A | * | 12/1995 | Assar et al. ............ | 706/900 |
| 5,566,314 A | * | 10/1996 | DeMarco et al. ....... | 711/103 |
| 5,627,783 A | * | 5/1997 | Miyauchi ................ | 365/185.11 |
| 5,663,901 A | * | 9/1997 | Wallace et al. ......... | 365/185.11 |
| 5,742,934 A | * | 4/1998 | Shinohara ............... | 711/103 |

FOREIGN PATENT DOCUMENTS

EP          0-392-895 A2  * 10/1990       ........... G11C/16/06

* cited by examiner

Primary Examiner—Guy J. Lamarre
(74) Attorney, Agent, or Firm—Hogan & Hartson, LLP

(57) ABSTRACT

A redundant data for substituting a sector in the second memory region for a damaged sector in the first memory region is stored in the 1088 sector of the flash memory (1), and a program-instruction for rewriting, the redundant data into the table RAM (7) and for writing a program instruction in a specific sector into a program RAM (3) is stored in the 0 sector of the flash memory (1). Because with this arrangement a separate redundant circuit is unnecessary, costs can be reduced.

11 Claims, 3 Drawing Sheets

ADDRESS CONVERSION DEVICE FOR NONVOLATILE MEMORY

BACKGROUND OF THE INVENTION

1. Field of the Invention

The present invention relates to an address conversion device for a nonvolatile memory, specifically a device which prevents designation of a damaged address in the nonvolatile memory.

2. Description of the Related Art

Flash memories have nonvolatile characteristics and capability of electric data erasure, data writing, and data reading. Furthermore, flash memories are particularly advantageous in that data can be accomplished in a relatively short amount of time as compared to EEPROM. Due to this superiority, flash memories of small and large capacities have come to be widely used. For example, small capacity flash memories can be found incorporated into a one-chip microcomputer as a program memory or a data memory, while large capacity flash memories are commonly provided on a substrate of a microprocessor as a peripheral circuit.

In manufacturing of flash memories, memory cells adapted to normal erasure, writing, and reading operation must be made. However, in actuality, it is extremely difficult to produce a flash memory in which all memory cells correctly function. Particularly, the difficulty of manufacturing large capacity flash memories results in a large number of damaged cells.

Because of this problem, to save damaged cells, a redundant circuit is commonly provided as a peripheral circuit for a flash memory.

Specifically, large capacity flash memories are divided into a plurality of sectors each storing program data, table data, and so on. In an example wherein one word comprises 16 bits and one sector comprises 1K words, a 16M-bit flash memory will comprise 1K sectors.

Providing redundant circuits, circuits for saving damaged flash memory cells in every sector, is expensive due to the large scale, and therefore only a small number of sectors (such as four sectors) can be saved. Therefore, when the number of defective sectors exceeds the number of savable sectors (4/1000), the flash memory itself must be treated as defective, thereby lowering manufacturing yield. Also, use of an external tester by a redundant circuit saving damaged cells may prolong testing times, which further increases manufacturing costs of flash memories.

SUMMARY OF THE INVENTION

The present invention aims at reduction of flash memory prices and improvement of manufacturing yields.

A nonvolatile memory of the present invention comprises a table wherein address data relating to a first memory region is written at an address corresponding to an address other than a damaged address in the first memory region in the nonvolatile memory, and substitutional address data relating to a second memory region is written at an address corresponding to a damaged address in the first memory region in the nonvolatile memory. With this arrangement, supplied address data which corresponds to the damaged address in the first memory region can be converted into address data which corresponds to the address in the second memory region.

BRIEF DESCRIPTION OF THE DRAWINGS

The above and other objects, features, and advantages of the present invention will become further apparent from the following description of the preferred embodiment taken in conjunction with the accompanying drawings wherein.

DESCRIPTION OF THE PREFERRED EMBODIMENTS

A preferred embodiment of the present invention will be described in detail referring to the accompanying drawings.

Figure 1:
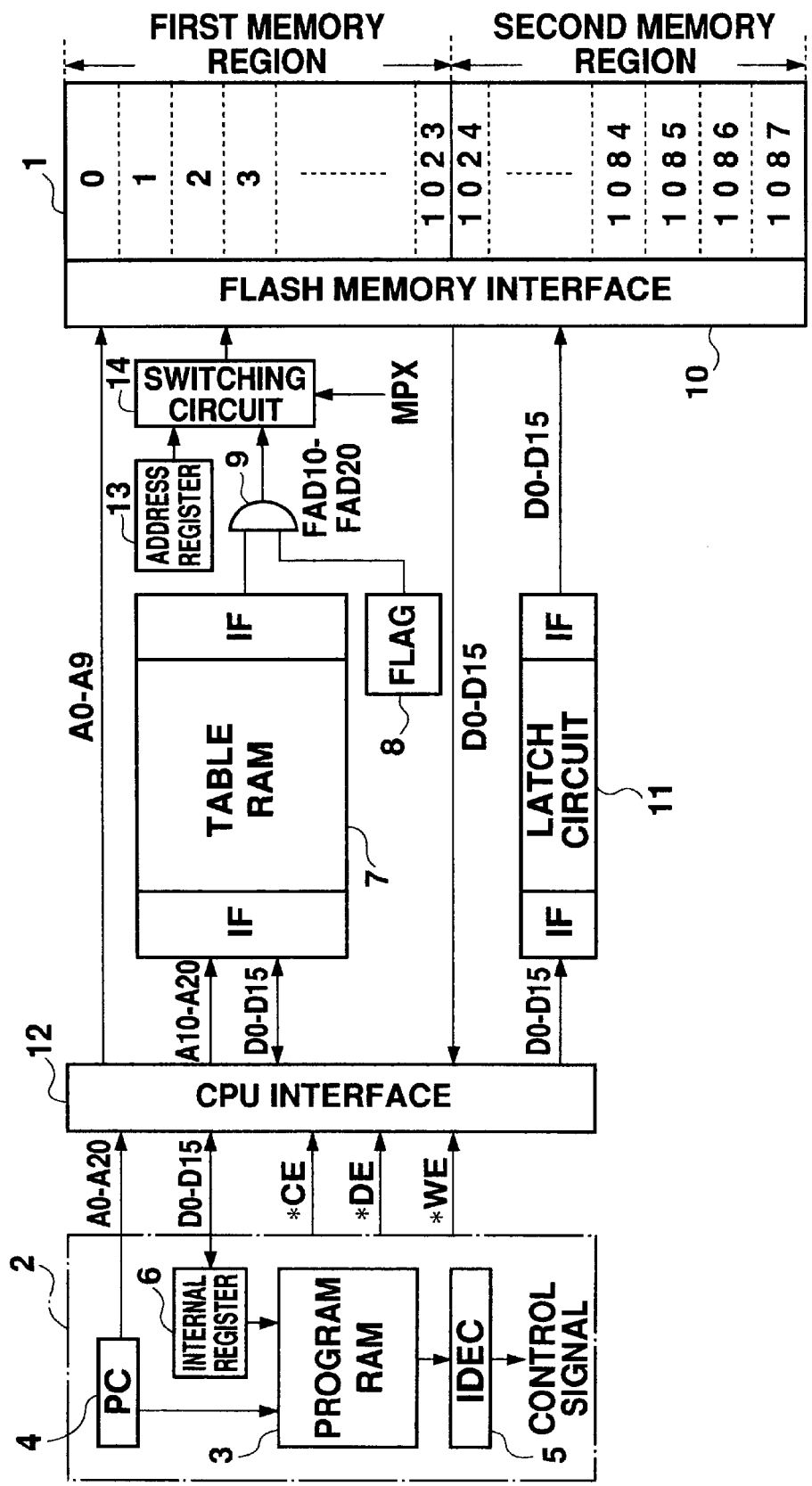
FIG. 1 is a block diagram showing an address conversion device of a nonvolatile memory according to the present invention.

FIG. 1 is a block diagram showing an address conversion device for a flash memory according to the present invention. The shown flash memory in FIG. 1 has nonvolatile characteristic with capability of electric data erasure, data writing and data reading. The flash memory 1 has a large capacity, and is divided into a plurality of sectors, each storing program data, table data, and so on. In this embodiment, the total memory capacity of the flash memory 1 is defined as 17M bits, one words comprises 16 bits, one sector comprises 1K words, and the flash memory 1 comprises 0 to 1087 sectors. Of the 0 to 1087 sectors, 0 to 10237 sectors are defined as first memory region for general use, and 1024 to 1087 sectors are defined as second memory region for substitutional use for any damaged address in the first memory region. That is, 16M bits of the flash memory 1 are used in general operation, and the remaining 1M bits are reserved for backup. Data erasure operation (writing a logical value "1") and writing operation (writing a logical value "0") are carried out with respect to the 0 to 1087 sectors of a finished flash memory 1 to find any damaged sector a with incompletely erased data, based on the content read from each sector, upon which pre-shipment check as to a damaged-sector condition with flash memories is completed.

Then, based on the information concerning damaged sectors, redundant data for substitution for any damaged sector in the first memory region by a predetermined sector in the second memory region is written in the 1087 sector in the flash memory 1. In addition, program data for storing the redundant data in a table RAM (described later) is written in the 0 sector of the flash memory 1, and program data for operating a peripheral microprocessor is written into a specific sector in the first memory region of the flash memory 1. It should be noted that this configuration is based on an assumption that the 0 sector, the specific sector, and the 1087 sector of the flash memory 1 are not damaged. With the above, flash memories 1 have been ready for shipment with the above various data pre-written therein.

A microprocessor 2 carries out various logical operations, peripheral circuit control, and so on using the flash memory 1 as a program memory. A program RAM 3 is a volatile memory (such as SRAM) and stores content of a specific sector in the first memory region of the flash memory 1. A program counter PC 4, which is initialized upon start of power supplying, outputs address data A0–A20 for address designation with the flash memory 1, and designates an address in the program RAM 3. An instruction decoder IDEC 5 decodes content read from the program RAM 3, and outputs control signals for various logical operations and peripheral to circuit control, and so on. An internal register 6 temporarily holds content read from a specific sector in the first memory region and that from the 1087 sector in the second memory region.

The table RAM 7 stores address data for designation of a sector in the flash memory 1. The table RAM 7 has addresses assigned for the 1024 sectors which are usually used in the flash memory 1, and moreover must be capable of designation of all of the 1088 sectors in order to cope with redundant processing. Therefore, one word for the table RAM 7 needs 11 bits (Ac–A20). When no sector is damaged in the first memory region in the flash memory 1, data FAD10–FAD20, identical to address data Ac–A20, are stored in the table RAM 7, so that the table RAM 7 can output data equivalent to the upper 11 bits, namely bits Ac–A20, of a value on the program counter 4. When a sector is damaged in the first memory region in the flash memory 1, on the other hand, address data indicative of a substitutional sector in the second memory region in the flash memory 1 is stored in the table RAM 7 at an address corresponding to the damaged sector. For example, when the 800 sector of the first memory region in the flash memory 1 is damaged and is to be substituted by the 1030 sector in the second memory region in the second flash memory 1, the table RAM 7 stores at address 800 address data FAD10–FAD20 indicative of the 1030 sector in the flash memory 1. Thus, address data FAD10–FAD20, indicative of the 1030 sector in the place of the 800 sector, is output from the table RAM 7.

A flag 8 is set at a logical value 0 upon release of reset with the entire device of FIG. 1. An output from the table RAM 7 and an output of the flag 8 are supplied via an AND gate 9 to a flash memory interface 10. That is, the 0 sector of the flash memory 1 is designated when the device is initialized. The flash memory interface 10 controls inputs of address data A0–A9, FAD10–FAD20, and inputs and outputs of data D0–D15. A latch circuit 11 latches data to be written into the flash memory 1. A CPU interface 12 controls data transfer between the microprocessor 2 and the flash memory 1, the table RAM 7, and the latch circuit 11. Values A0–A20 on the program counter 4 are divided into upper 11 bits Ac–A20 and lower 10 bits A0–A9 by the CPU interface 12. The upper 11 bits Ac–A20 are used to designate a sector in the flash memory 1, while the lower 10 bits are used to designate an address within the sector. Address data FAD10–FAD20, indicative of 1087, is set to the address register 13 at the time of initialization. A switch circuit 14 switches values with the address register 13 in response to a switching signal MPX at a high level, to output. Note that the flash memory 1, the program RAM 3, and the table RAM 7 carry out data reading when a reading enable signal OE becomes of low level, and carries out data writing when a reading enable signal *WE becomes of low level.

Figure 2:
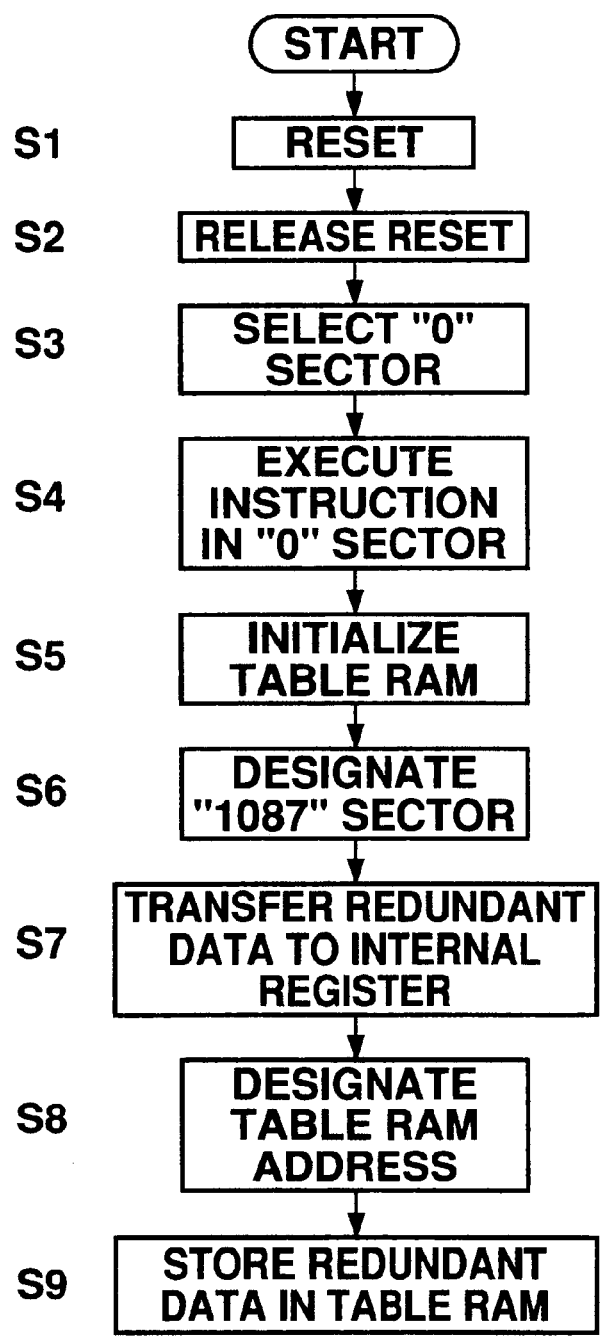
FIG. 2 is a flowchart of operation to store redundant data by the device of FIG. 1.

Operation of data storing into the table RAM 7 will next be described with reference to the flowchart of FIG. 2.

With power turned on, the entire device of FIG. 1 is reset. That is, all bits of values A0–A20 on the program counter 4 are set at logical values "0" (S1). As a predetermined amount of time has passed, resetting of the entire device is released whereby the logical value "0" is set to the flag 8. When an operation enabling signal CE and a reading enabling signal OE become of low level, i(g the flash memory 1 is rendered into a reading condition (S2). Although the content of the table RAM 7 is then indefinite, as the flag 8 indicates a logical value "0 ", 11-bit output FAD10–FAD20 from the AND gate 9 are fixed at a logical value "0", so that the 0 sector of the flash memory 1 is accordingly selected (S3). Program data D0–D15 in the 0 sector is decoded by the instruction decoder 5 for execution. Specifically, the lower 10 bits A0–A9 on the program counter 4 are added according to the number of operation instructions to change an address in the 0 sector for reading-out (S4). Initially, the upper 11 bits Ac–A20 on the program counter 4 are changed so that data FAD10–FAD20, equivalent to the address data Ac–A20, are written in the table RAM 7. In other words, address data FAD10–FAD20 for selection of 0–1023 sectors are written in the table RAM 7 at addresses 0–1023, so that condition free from any damaged sector is created in the first memory region of the flash memory 1 (S5). Then, a switching signal MPX is changed to a high level for selection of the 1087 sector (S6). Further, the lower 10 bits A0–A9 of the program counter 4 are changed for designation of an address within the 1087 sector to read redundant data therefrom to be transferred to the internal register 6 (S7). Then, an address in the table RAM 7, corresponding to a damaged sector in the flash memory 1 is designated to store redundant data therein (S9) to thereby complete data storage into the table RAM 7. When the address values Ac–A20 on the program counter 4 indicate a damaged sector in the first memory region of the flash memory 1, address values FAD10–FAD20 read from the table RAM 7 are converted into address values for a sector in the second memory region in substitution for the damaged sector in the first memory region.

Figure 3:
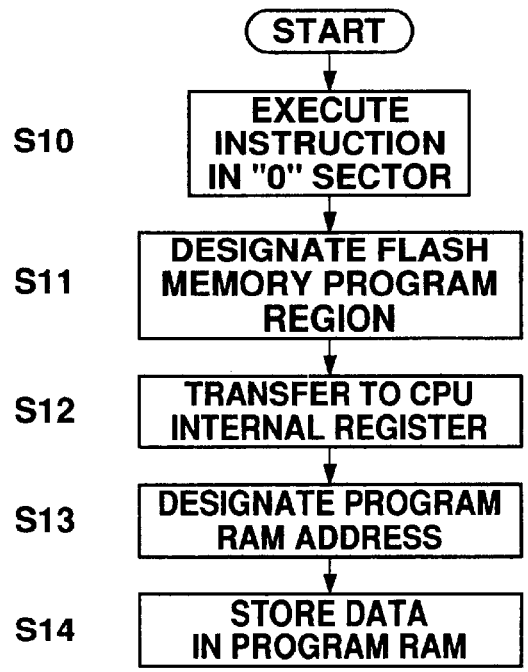
FIG. 3 is a flowchart of operation to store program data by the device of FIG. 1.

Operation for program storage to the program RAM 3 will next be described with reference to the flowchart of FIG. 3. Note that the content of the table RAM 7 has by this point been confirmed. When a section is damaged in the first memory region of the flash memory 1, the table RAM 7 converts supplied address data Ac–A20, indicative of the damaged sector in the first memory region of the flash memory 1, into address data FAD10–FAD20, indicative of a predetermined sector in the second memory region in substitution for the damaged sector.

Initially, while the flag 8 remains at a logical value "1", the microprocessor 2 selects the 0 sector in the flash memory 1. A program instruction read from the 0 sector is decoded by the instruction decoder 5 in the microprocessor 2 to be executed as follows (S10). That is, address data A0–A20 indicative of a specific section in the flash memory 1 where an operation control program for a microprocessor is stored, is obtained from the program counter 4. The table RAM 7 receives the upper 11 bits of the address Ac–A20 of the address data via the CPU interface 12, and reads address data FAD10–FAAD20 for designation of a specific sector to therewith designate a specific sector, including a substitutional sector of a damaged sector, if any, in the flash memory 1 (Sli). Then, program data is transferred to the internal register (6) (S12). Further, an address in the program RAM (3) is designated (S13), and the content read from the internal register 6 is written into the program RAM 3 (S14). With the above, program storing operation to the program RAM 3 is completed. The microprocessor 2 then operates according to a program instruction stored in the program RAM 3, which is then in a condition capable of program control over the peripheral circuit.

Figure 4:
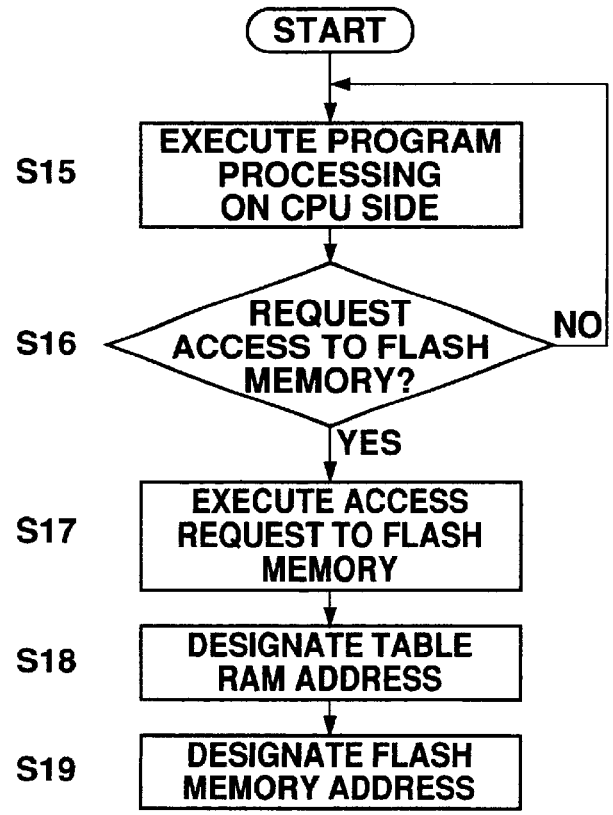
FIG. 4 is a flowchart of operation of a microprocessor by the device of FIG. 1.

Operation of the microprocessor 2 will next be described with reference to the flowchart of FIG. 4.

According to a program instruction read from the program RAM 3 and then decoded by the instruction decoder 5, the microprocessor 2 carries out general operation such as various operations and peripheral circuit control (S15). When an interrupt request to use data in the flash memory 1 should occur during the ordinary operation (S16:YES), a value on the program counter 4 is changed, so that subroutine processing starts for address designation with the flash memory 1 (S17). That is, address data A10–A20 are supplied to the table RAM 7 (S18) to designate an address in the flash memory 1 (S18).

As a result, the present invention can realize a number of advantages.

One such advantage is that a separate redundant circuit is unnecessary. This in turn contributes to circuit size reduction, test time shortening as an external tester need not be used in saving a damaged cell, and, eventually, price increase suppression.

Another advantage is that, even when the number of damaged sectors required to be saved in the flash memory 1 is increased and the respective damaged sectors have different addresses in the flash memory 1, it is possible to counter such a problem by simply rewriting the content of the table RAM 7. Therefore, a manufacturing yield for flash memories 1 can be improved.

When a certain sector in the flash memory 1 is damaged due to frequent rewriting, that flash memory 1 is still usable when the content of the table RAM 7 is rewritten. Because of this advantage, the life of the flash memory 1 can be prolonged.

What is claimed is:

1. An address conversion device for a nonvolatile memory configured for electric data erasure, data writing, and data reading, and including a first memory region for general use, and a second memory region in substitution for any damaged address in the first memory region, the address conversion device, comprising:

a table written, at an address corresponding to an address other than a damaged address in the first memory region of the nonvolatile memory, by address data relating to the first memory region, and, at an address corresponding to the damaged address in the first memory region of the nonvolatile memory, by address data in the second memory region in substitution for the damaged data wherein supplied address data is converted into address data stored at an address in the table corresponding to the supplied address data and then output, redundant data for conversion into the address data relating to the second memory region in substitution for the damaged address in the first memory region is written in a first specific block of the nonvolatile memory, and the address data relating to the second memory region in substitution for the damaged address in the first memory region is written at an address of the table corresponding to the damaged address in the first memory region, based on the redundant data, a program instruction for writing data into the table, using the redundant data, is stored in a second specific block of the nonvolatile memory, and the address data relating to the second memory region in substitution for the damaged address in the first memory region is written at an address of the table corresponding to the damaged address in the first memory region through execution of the program instruction, whereby separate redundant circuit is unnecessary, and the first memory region and the second memory region of the nonvolatile memory are respectively divided into a plurality of blocks.

2. An address conversion device according to claim 1, wherein the table is used for converting a predetermined number of upper bits of address data, the predetermined number of upper bits of address data specifying a block in the first memory region.

3. An address conversion device according to claim 2, wherein the table has memory capacity corresponding to the number of blocks in the first memory region.

4. An address conversion device according to claim 1, further comprising a setting circuit for setting an initial value to an output from the table, and a block where a program instruction for writing the address data relating to the second memory region in substitution for the damaged address in the first memory region is stored, is designated according to the initial value.

5. An address conversion device according to claim 1, wherein the table stores addresses for all of a plurality of sectors of the nonvolatile memory.

6. An address conversion device according to claim 1, wherein the redundant data is stored in the first specific block in the second region of the nonvolatile memory.

7. A nonvolatile memory configured for of electric data erasure, data writing, and data reading, comprising:

a first memory region for general use, and a second memory region in substitution for a damaged address, if any, in the first memory region, wherein redundant data for conversion into address data relating to the second memory region in substitution for the damaged address in the first memory region is written at a predetermined part, whereby a separate redundant circuit is unnecessary.

8. A nonvolatile memory according to claim 7, wherein the first memory region and the second memory region are respectively divided into a predetermined number of blocks, and the redundant data is data for conversion of solely a predetermined number of upper bits of the address data, the predetermined number of upper bits specify a block in the first memory region.

9. A nonvolatile memory according to claim 8, wherein a program instruction for writing data into the table, using the redundant data, is stored in a second specific block of the nonvolatile memory.

10. A nonvolatile memory according to claim 9, wherein the redundant data is stored in a trailing block of the nonvolatile memory.

11. A nonvolatile memory according to claim 10, wherein the program instruction is stored in a leading block of the nonvolatile memory.

* * * * *